（12）United States Patent
Lee

(10) Patent No.: US 11,386,965 B2
(45) Date of Patent: Jul. 12, 2022

(54) MEMORY DEVICE, MEMORY SYSTEM INCLUDING THE MEMORY DEVICE, AND OPERATING METHOD OF THE MEMORY SYSTEM

(71) Applicant: SK hynix Inc., Gyeonggi-do (KR)

(72) Inventor: Dong Uk Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 70 days.

(21) Appl. No.: 16/599,297

(22) Filed: Oct. 11, 2019

(65) Prior Publication Data

US 2020/0365212 A1    Nov. 19, 2020

(30) Foreign Application Priority Data

May 16, 2019 (KR) ........................ 10-2019-0057522

(51) Int. Cl.
| | | |
|---|---|---|
| *G11C 16/26* | (2006.01) | |
| *G06F 11/10* | (2006.01) | |
| *G11C 29/52* | (2006.01) | |
| *G11C 16/14* | (2006.01) | |
| *G11C 11/56* | (2006.01) | |
| *G11C 16/10* | (2006.01) | |
| G11C 16/30 | (2006.01) | |
| G11C 16/04 | (2006.01) | |

(52) U.S. Cl.
CPC .......... *G11C 16/26* (2013.01); *G06F 11/1068* (2013.01); *G11C 11/5671* (2013.01); *G11C 16/10* (2013.01); *G11C 16/14* (2013.01); *G11C 29/52* (2013.01); *G11C 16/0483* (2013.01)

(58) Field of Classification Search
None
See application file for complete search history.

(56) References Cited

U.S. PATENT DOCUMENTS

| 5,969,993 A * | 10/1999 | Takeshima | G11C 16/3431 365/185.29 |
|---|---|---|---|
| 6,169,307 B1 * | 1/2001 | Takahashi | G11C 16/0416 257/315 |
| 6,396,744 B1 * | 5/2002 | Wong | G11C 11/56 365/185.22 |

(Continued)

FOREIGN PATENT DOCUMENTS

| KR | 10-1826140 | 3/2018 |
|---|---|---|
| KR | 10-2018-0064088 | 6/2018 |

*Primary Examiner* — Cynthia Britt
*Assistant Examiner* — Dipakkumar B Gandhi
(74) *Attorney, Agent, or Firm* — IP & T Group LLP

(57) ABSTRACT

There are provided a memory device, a memory system including the memory device, and an operating method of the memory system. The memory device includes a memory cell array including a plurality of memory blocks, a peripheral circuit for performing a read operation by applying a read voltage to a selected memory block among the plurality of memory blocks, and control logic for controlling the peripheral circuit to perform a normal read operation using initially set voltages and a read retry operation using new read voltages. The peripheral circuit performs the read retry operation by using the new read voltage corresponding to program states other than at least one program state included in a specific threshold voltage region among a plurality of program states of the selected memory block.

21 Claims, 10 Drawing Sheets

(56) References Cited

U.S. PATENT DOCUMENTS

| | | | |
|---|---|---|---|
| 9,672,914 B1* | 6/2017 | Park | G11C 16/04 |
| 2005/0226048 A1* | 10/2005 | Lee | G11C 16/0483 |
| | | | 365/185.17 |
| 2008/0205152 A1* | 8/2008 | Kang | G11C 11/5642 |
| | | | 365/185.18 |
| 2010/0002515 A1* | 1/2010 | Lutze | G11C 16/3418 |
| | | | 365/185.17 |
| 2010/0195404 A1* | 8/2010 | Lee | G11C 11/5635 |
| | | | 365/185.22 |
| 2011/0110154 A1* | 5/2011 | Kim | G11C 16/0483 |
| | | | 365/185.03 |
| 2012/0269007 A1* | 10/2012 | Yang | G11C 7/10 |
| | | | 365/189.011 |
| 2013/0024751 A1* | 1/2013 | Yang | H03M 13/152 |
| | | | 714/781 |
| 2013/0036261 A1* | 2/2013 | Kim | G06F 11/1048 |
| | | | 711/103 |
| 2013/0215678 A1* | 8/2013 | Yang | G06F 11/1048 |
| | | | 365/185.03 |
| 2014/0063944 A1* | 3/2014 | Lee | G11C 29/52 |
| | | | 365/185.09 |
| 2016/0071586 A1* | 3/2016 | Ogiwara | G11C 13/003 |
| | | | 365/163 |
| 2016/0357472 A1* | 12/2016 | Choi | G06F 11/1048 |
| 2017/0060463 A1* | 3/2017 | Shim | G06F 3/0688 |
| 2019/0362796 A1* | 11/2019 | Choi | G06F 11/1072 |

* cited by examiner

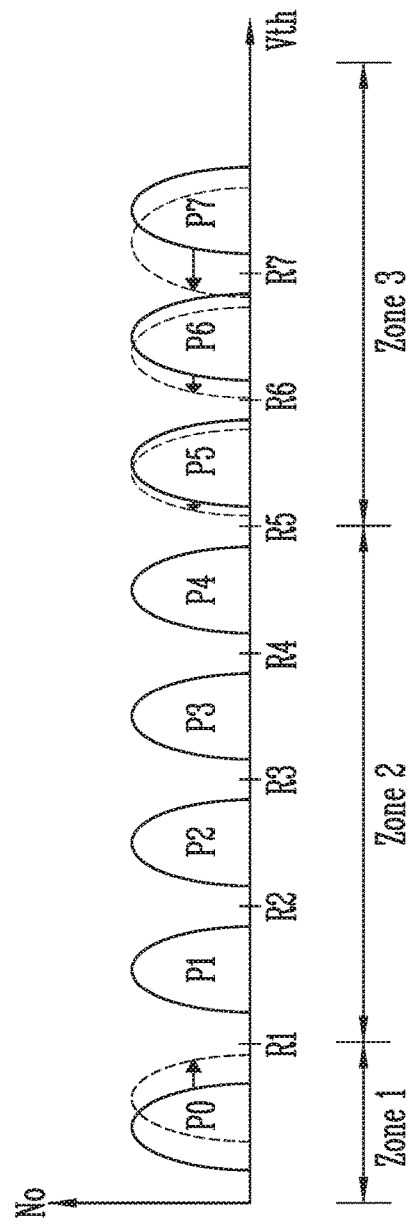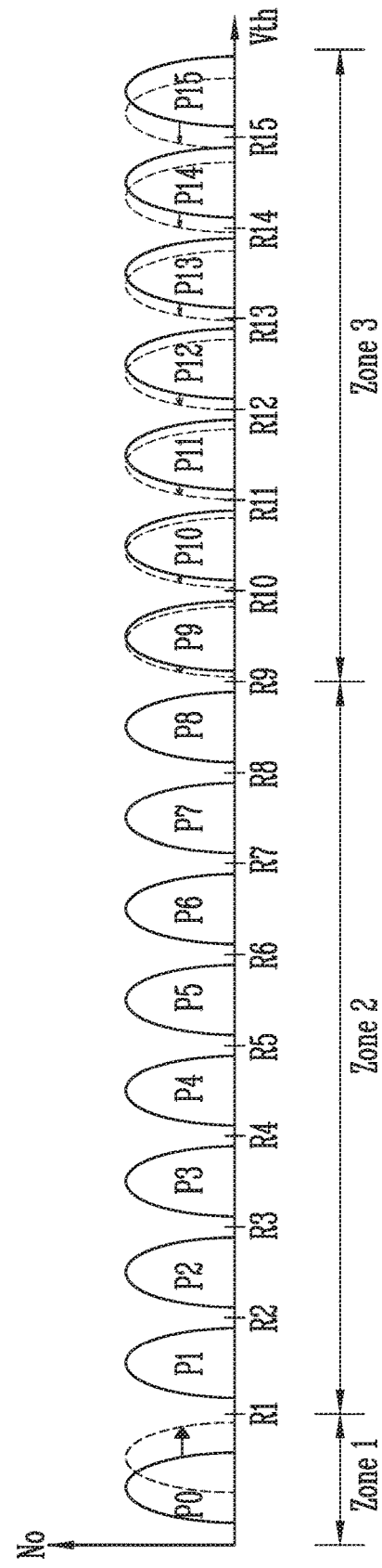

MEMORY DEVICE, MEMORY SYSTEM INCLUDING THE MEMORY DEVICE, AND OPERATING METHOD OF THE MEMORY SYSTEM

CROSS-REFERENCE TO RELATED APPLICATION

The present application claims priority under 35 U.S.C. § 119(a) to Korean patent application number 10-2019-0057522, filed on May 16, 2019, which is incorporated herein by reference in its entirety.

BACKGROUND

Field of Invention

The present disclosure generally relates to an electronic device, and more particularly, to a memory device, a memory system including the memory device, and an operating method of the memory system.

Description of Related Art

The paradigm for the current computer environment has transitioned to a ubiquitous computing environment in which computing systems can be used anywhere and anytime. This promotes increased usage of portable electronic devices such as mobile phones, digital cameras, notebook computers, and the like. Such portable electronic devices may generally include a memory system using a memory device, i.e., a data storage device. The data storage device is used as a main memory device or an auxiliary memory device of the portable electronic devices.

A data storage device using a memory device has excellent stability and durability, high information access speed, and low power consumption, since there is no mechanical driving part. In an exemplary memory system having such advantages, the data storage device may be any of various types including a Universal Serial Bus (USB) memory device, memory cards having various interfaces, a Solid State Drive (SSD), and the like.

SUMMARY

Embodiments provide a memory device capable of improving an operation speed in a read retry operation of a memory system, the memory system including the memory device, and a method of operating the memory system.

In accordance with an aspect of the present disclosure, there is provided a memory device including: a memory cell array having a plurality of memory blocks; a peripheral circuit configured to perform a read operation by applying a read voltage to a selected memory block among the plurality of memory blocks; and control logic configured to control the peripheral circuit to perform a normal read operation using initially set voltages and a read retry operation using new read voltages, wherein the peripheral circuit performs the read retry operation by using the new read voltage corresponding to program states other than at least one program state included in a specific threshold voltage region among a plurality of program states of the selected memory block.

In accordance with another aspect of the present disclosure, there is provided a memory system including: a memory device having a plurality of memory blocks and a peripheral circuit for performing a normal read operation and a read retry operation on a selected memory block among the plurality of memory blocks; and a controller configured to control the memory device to perform the normal read operation in response to a request received from a host, and control the memory device to perform the read retry operation according to a number of error bits of read data received from the memory device, wherein the controller controls the memory device to perform the read retry operation with respect to program states other than at least one program state included in a specific threshold voltage region among a plurality of program states of the selected memory block.

In accordance with still another aspect of the present disclosure, there is provided a method for operating a memory system, the method including: reading a read retry table stored in a memory device in a power-on operation; performing a normal read operation on a selected memory block among a plurality of memory blocks included in the memory device; determining whether an error correction operation is to be performed according to a number of error bits in data read in performing the normal read operation; setting a new read voltage, when it is determined that the error correction operation is not to be performed; and performing a read retry operation on the selected memory block using the new read voltage, wherein new read voltage corresponds to program states other than at least one program state included in a specific threshold voltage region among a plurality of program states of the selected memory block.

BRIEF DESCRIPTION OF THE DRAWINGS

Various embodiments are described more fully below with reference to the accompanying drawings; however, the present invention may be embodied in different forms and thus is not limited to the embodiments set forth herein. Rather, these embodiments are provided so that this disclosure is thorough and complete and fully conveys the scope of the invention embodiments to those skilled in the art.

In the drawing figures, dimensions may be exaggerated for clarity of Illustration. Like reference numerals refer to like elements throughout. Throughout the specification, reference to "an embodiment," "another embodiment" or the like is not necessarily to the same embodiment, and different references to any such phrase are not necessarily to different embodiment(s).

FIG. 7 is a threshold voltage distribution diagram illustrating threshold voltage distributions according to program states of memory cells in accordance with an embodiment of the present disclosure.

FIG. 8 is a threshold voltage distribution diagram illustrating threshold voltage distributions according to program states of memory cells in accordance with another embodiment of the present disclosure.

DETAILED DESCRIPTION

Figure 1:
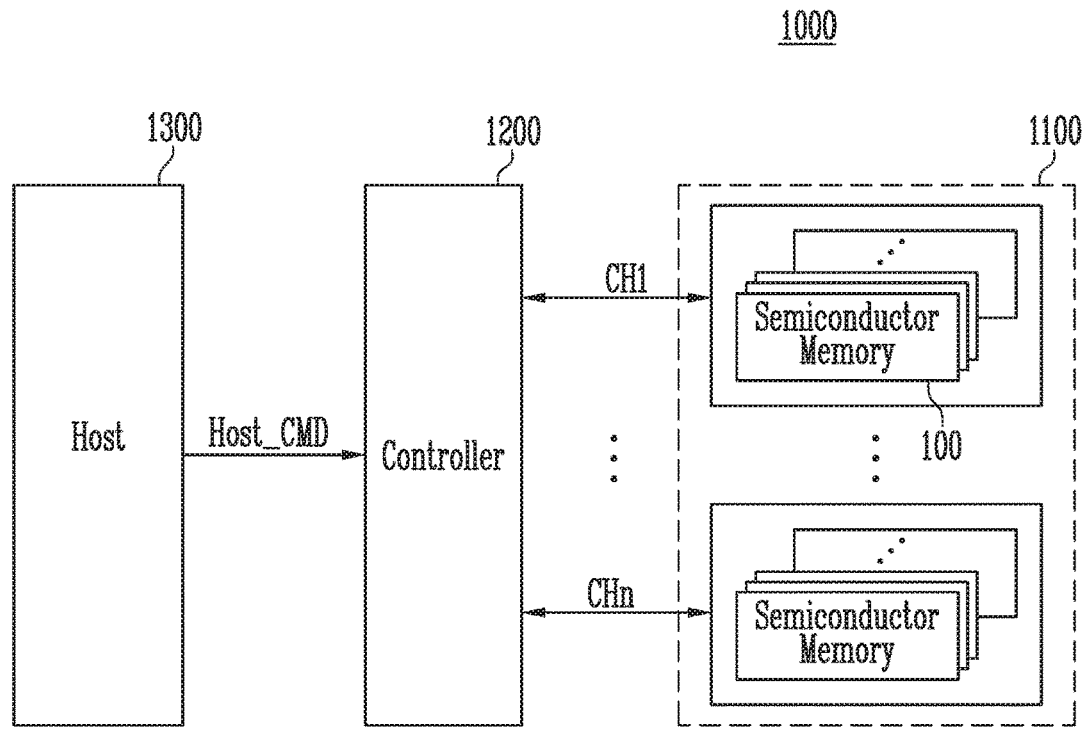
FIG. 1 is a block diagram illustrating a memory system in accordance with an embodiment of the present disclosure.

The specific structural and functional description herein is merely for the purpose of describing embodiments of the present invention. The present invention, however, may be implemented in various configurations and ways and thus is not limited to the embodiments set forth herein. The present invention is intended to encompass all changes, equivalents and substitutes that do not depart from the spirit and scope of the present invention.

While terms such as "first" and "second" may be used to Identify various components, such components must not be understood as being limited to the above terms. The above terms are used only to distinguish one component from another. For example, a first component may be referred to as a second component in another instance or vice versa without implying any change in substance of the subject component.

It will be understood that when an element is referred to as being "connected" or "coupled" to another element, it can be directly connected or coupled to the other element or one or more intervening elements may also be present. In contrast, when an element is referred to as being "directly connected" or "directly coupled" to another element, no Intervening elements are present. Similarly, when an element is referred to as being "between" two elements, such statement does not preclude the presence of one or more other elements between the two elements.

The terms used in the present application are merely used to describe particular embodiments, and are not intended to limit the present invention. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

So far as not being differently defined, all terms used herein including technical or scientific terminologies have meanings that are commonly understood by those skilled in the art to which the present disclosure pertains. Ordinary dictionary-defined terms should be understood such that the terms have meanings consistent with the context of the related technique. So far as not being clearly defined in this application, terms should not be understood in an ideal or excessively formal way.

In describing embodiments, description of techniques that are well known to the art to which the present disclosure pertains and are not directly related to the present disclosure may be omitted. This intends to more clearly focus the description on aspects and features of the present invention.

Various embodiments of the present disclosure are described in detail below with reference to the accompanying drawings to enable those skilled in the art to practice the present invention.

FIG. 1 is a block diagram illustrating a memory system in accordance with an embodiment of the present disclosure.

Referring to FIG. 1, the memory system 1000 includes a memory device 1100, a controller 1200, and a host 1300. The memory device 1100 includes a plurality of semiconductor memories 100. The plurality of semiconductor memories 100 may be divided into a plurality of groups. Although a configuration in which the host 1300 is included in the memory system 1000 is illustrated and described in connection with the embodiment of FIG. 1, in another embodiment the memory system 1000 may include only the controller 1200 and the memory device 1100, and the host 1300 may be disposed externally to the memory system 1000.

In FIG. 1, a configuration in which the plurality of, i.e., n groups of the memory device 1100 communicate with the controller 1200 respectively through first to nth channels CH1 to CHn is illustrated. Each semiconductor memory 100 is described below with reference to FIG. 3.

Each semiconductor memory 100 of a particular group communicates with the controller 1200 through one common channel. The controller 1200 controls the plurality of semiconductor memories 100 of the memory device 1100 through the plurality of channels CH1 to CHn.

The controller 1200 is coupled between the host 1300 and the memory device 1100. The controller 1200 accesses the memory device 1100 in response to a request from the host 1300. For example, the controller 1200 controls read, write, erase, and background operations of the memory device 1100 in response to a host command Host_CMD received from the host 1300. In the write operation, the host 1300 may transmit data and an address together with the host command Host_CMD. In the read operation, the host 1300 may transmit an address together with the host command Host_CMD. The controller 1200 provides an interface between the memory device 1100 and the host 1300. The controller 1200 drives firmware for controlling the memory device 1100.

The controller 1200 may read data about a read retry table stored in the memory device 1100 in a power-on operation, and store the read data in the controller 1200. The controller 1200 may perform an error correction operation using an Error Correction Code (ECC) on read data received from the memory device 1100 in a read operation of the memory system 1000. When the error correction operation fails, the controller 1200 may set a new read voltage according to the read retry table, and control the memory device 1100 to re-perform a read operation (read retry operation) by using the set read voltage.

In an embodiment of the present disclosure, the controller 1200 may control the memory device to group a plurality of program states into a plurality of threshold voltage regions according to threshold voltage distributions. With respect to program states in a specific threshold voltage region, a read operation may be performed with an initially set read voltage and the read retry operation may be skipped. Accordingly, the read retry table does not include information on new read voltages corresponding to the program states included in the specific threshold voltage region, and may include only information on new read voltages corresponding to program states included in the threshold voltage regions other than the specific threshold voltage region. Accordingly, the amount of information Included in the read retry table is decreased. Thus, the speed of a program operation and a read operation of the read retry table is increased, and data storage efficiency is improved. A more detailed description of the plurality of threshold voltage regions described above is given below with reference to FIGS. 7 and 8.

The host 1300 includes any of various portable electronic devices such as a computer, a PDA, a PMP, an MP3 player, a camera, a camcorder, and a mobile phone. The host 1300 may request a write operation, a read operation, an erase operation, etc. of the memory system 1000 through a host command Host_CMD. In order to perform a write operation of the memory device 1100, the host 1300 may transmit, to the controller 1200, a host command Host_CMD, data, and an address, which correspond to a write command. In order to perform a read operation of the memory device 1100, the host 1300 may transmit, to the controller 1200, a host command Host_CMD and an address, which correspond to a read command. The address may be a logical address.

The controller 1200 and the memory device 1100 may be integrated into one semiconductor device. In an embodiment, the controller 1200 and the memory device 1100 may be integrated into one semiconductor device to constitute a memory card, such as a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD card (SD, miniSD, microSD or SDHC), or a Universal Flash Storage (UFS).

In another embodiment, the controller 1200 and the memory device 1100 may be integrated into one semiconductor device to constitute a semiconductor drive (Solid State Drive (SSD)). The semiconductor drive SSD includes a storage device configured to store data in a semiconductor memory.

In another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multi-Media Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the memory device 1100 or the memory system 1000 may be packaged in any of various forms. For example, the memory device 1100 or the memory system 1000 may be packaged as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), Plastic Metric Quad Flat Pack (PMQFP), Thin Quad Flat Pack (TQFP), Small Outline Integrated Circuit (SOIC), Shrink Small Outline Package (SSOP), Thin Small Outline Package (TSOP), Thin Quad Flat Pack (TQFP), System In Package (SIP), Multi-Chip Package (MCP), Wafer-level Fabricated Package (WFP), or Wafer-level processed Stack Package (WSP).

Figure 2:
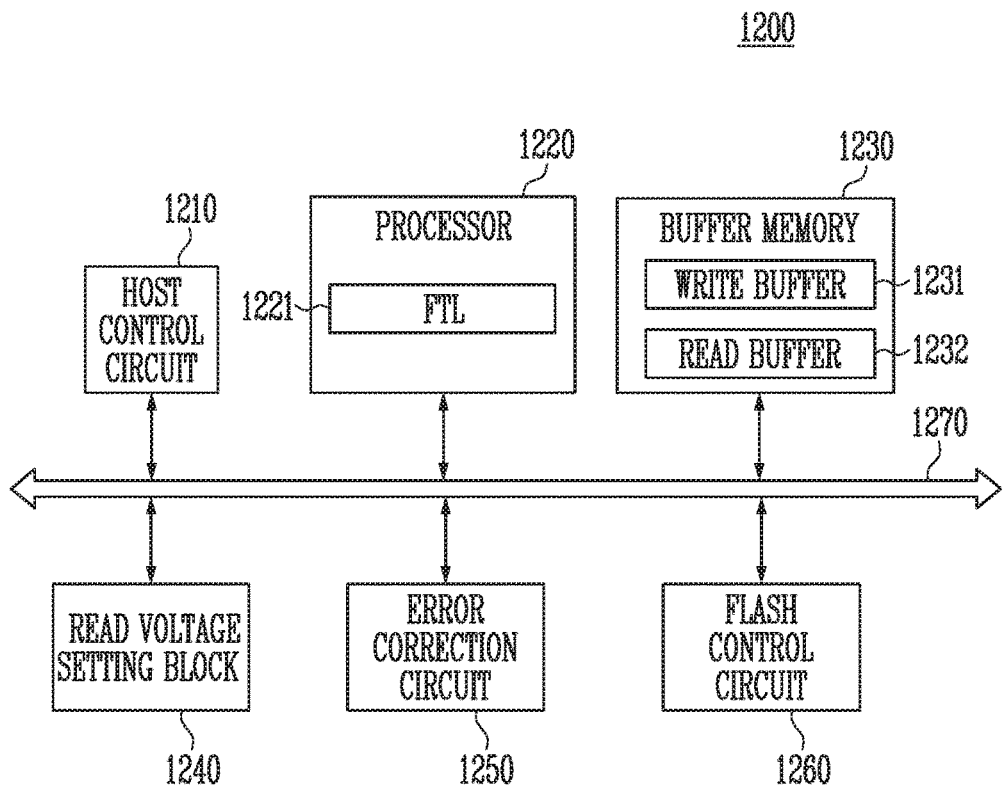
FIG. 2 is a block diagram illustrating a configuration of a controller, such as that shown in FIG. 1.

FIG. 2 is a block diagram illustrating a configuration of the controller shown in FIG. 1.

Referring to FIG. 2, the controller 1200 may include a host control circuit 1210, a processor 1220, a buffer memory 1230, a read voltage setting block 1240, an error correction circuit 1250, a flash control circuit 1260, and a bus 1270.

The bus 1270 may provide a channel between components of the controller 1200.

The host control circuit 1210 may control data transmission between the host 1300 shown in FIG. 1 and the buffer memory 1230. In an example, the host control circuit 1210 may control an operation of buffering data input from the host 1300 to the buffer memory 1230. In another example, the host control circuit 1210 may control an operation of outputting the data buffered to the buffer memory 1230 to the host 1300.

The host control circuit 1210 may include a host interface.

The processor 1220 may control the overall operations of the controller 1200, and perform a logical operation. The processor 1220 may communicate with the host 1300 shown in FIG. 1 through the host control circuit 1210, and communicate with the memory device 1100 shown in FIG. 1 through the flash control circuit 1260. Also, the processor 1220 may control an operation of the memory system 1000 by using the buffer memory 1230 as a working memory, cache memory or buffer memory. The processor 1220 may control the flash control circuit 1260 by generating a command queue by realigning a plurality of host commands received from the host 1300 according to an order of priority. The processor 1220 may include a Flash Translation Layer (FTL) 1221 and the read voltage setting block 1240. The processor 1220 may control the error correction circuit 1250 to perform an error correction operation using an ECC on read data received from the memory device 1100 shown in FIG. 1 in a read operation. When the error correction operation using the ECC fails, the processor 1220 may control the memory device 1100 to perform a read retry operation. For example, the processor 1220 may generate a command queue corresponding to the read retry operation, and the flash control circuit 1260 may control the memory device 1100 to perform the read retry operation in response to the command queue corresponding to the read retry operation.

The FTL 1221 controls the memory device 1100 by driving firmware. The firmware may be stored in an additional memory (not shown) directly coupled to the buffer memory 1230 or a storage space in the processor 1220. The FTL 1221 may map a corresponding physical address to an address (e.g., a logical address) input from the host 1300 shown in FIG. 1 in a write operation. Also, the FTL 1221 checks the physical address mapped to the logical address input from the host 1300 in a read operation.

Also, the FTL 1221 may generate a command queue for controlling the flash control circuit 1260 in response to a host command received from the host 1300.

The buffer memory 1230 may be used as a working memory, cache memory or buffer of the processor 1220. The buffer memory 1230 may store codes and commands, which are executed by the processor 1220. The buffer memory 1230 may store data processed by the processor 1220.

The buffer memory 1230 may include a write buffer 1231 and a read buffer 1232. The write buffer 1231 temporarily stores data received from the host 1300 in a write operation and then transmits the temporarily stored data to the memory device 1100 when an internal command corresponding to the write operation is transmitted to the memory device 1100. The read buffer 1232 temporarily stores data received from the memory device 1100 in a read operation and then transmits the temporarily stored data to the host 1300. The buffer memory 1230 may receive or store data about a read retry table stored in the memory device 1100 in a power-on operation of the memory system 1000 shown in FIG. 1.

The buffer memory 1230 may Include a Static RAM (SRAM) or Dynamic RAM (DRAM).

The read voltage setting block 1240 may store information on initially set read voltages corresponding to a normal read operation of the memory device 1100 shown in FIG. 1, and transmit the information on the Initially set read voltages to the memory device 1100. Also, when a read retry operation is performed since an error correction operation using an ECC on read data read by the normal read fails, the read voltage setting block 1240 may set new read voltages, based on a read retry table stored in the buffer memory 1230, and transmit information on the newly set read voltages to the memory device 1100. The new read voltages are read voltages corresponding to a program state included in the threshold voltage regions other than a specific threshold voltage region among a plurality of threshold voltage regions.

In some embodiments, the read voltage setting block 1240 may be included in the processor 1220.

The error correction circuit 1250 may perform an error correction operation. The error correction circuit 1250 may perform ECC encoding, based on data to be written to the memory device 1100 shown in FIG. 1 through the flash control circuit 1260. The ECC-encoded data may be transferred to the memory device 1100 through the flash control circuit 1260. The error correction circuit 1250 may perform ECC decoding on read data received from the memory device 1100 through the flash control circuit 1260. The error correction circuit 1250 may be configured with an ECC circuit with a specific error correction capability. Such ECC circuit may be one of a plurality of ECC circuits have different maximum error allowable bit numbers. Also, the error correction circuit 1250 may detect and count error bits of read data received from the memory device 1100 in a read operation, and transmit the counted error bit number to the processor 1220. When the counted error bit number is greater than a maximum allowable error bit number of the error correction circuit 1250, the error correction circuit 1250 may determine that the error correction operation has failed.

In an example, the error correction circuit 1250 may be Included as a component of the flash control circuit 1260 in the flash control circuit 1260.

The flash control circuit 1260 generates and outputs an Internal command for controlling the memory device 1100 in response to the command queue generated by the processor 1220. The flash control circuit 1260 may control a write operation by transmitting data buffered to the write buffer 1231 of the buffer memory 1230 to the memory device 1100 in the write operation. In another example, the flash control circuit 1260 may control an operation of buffering data read from the memory device 1100 to the read buffer 1232 of the buffer memory 1230 in response to the command queue in a read operation. Also, the flash control circuit 1260 may control the memory device 1100 to perform a read retry operation by transmitting, to the memory device, information on read voltages newly set by the read voltage setting block 1240 in the read retry operation and an Internal command corresponding to the read retry operation.

The flash control circuit 1260 may include a flash Interface.

Figure 3:
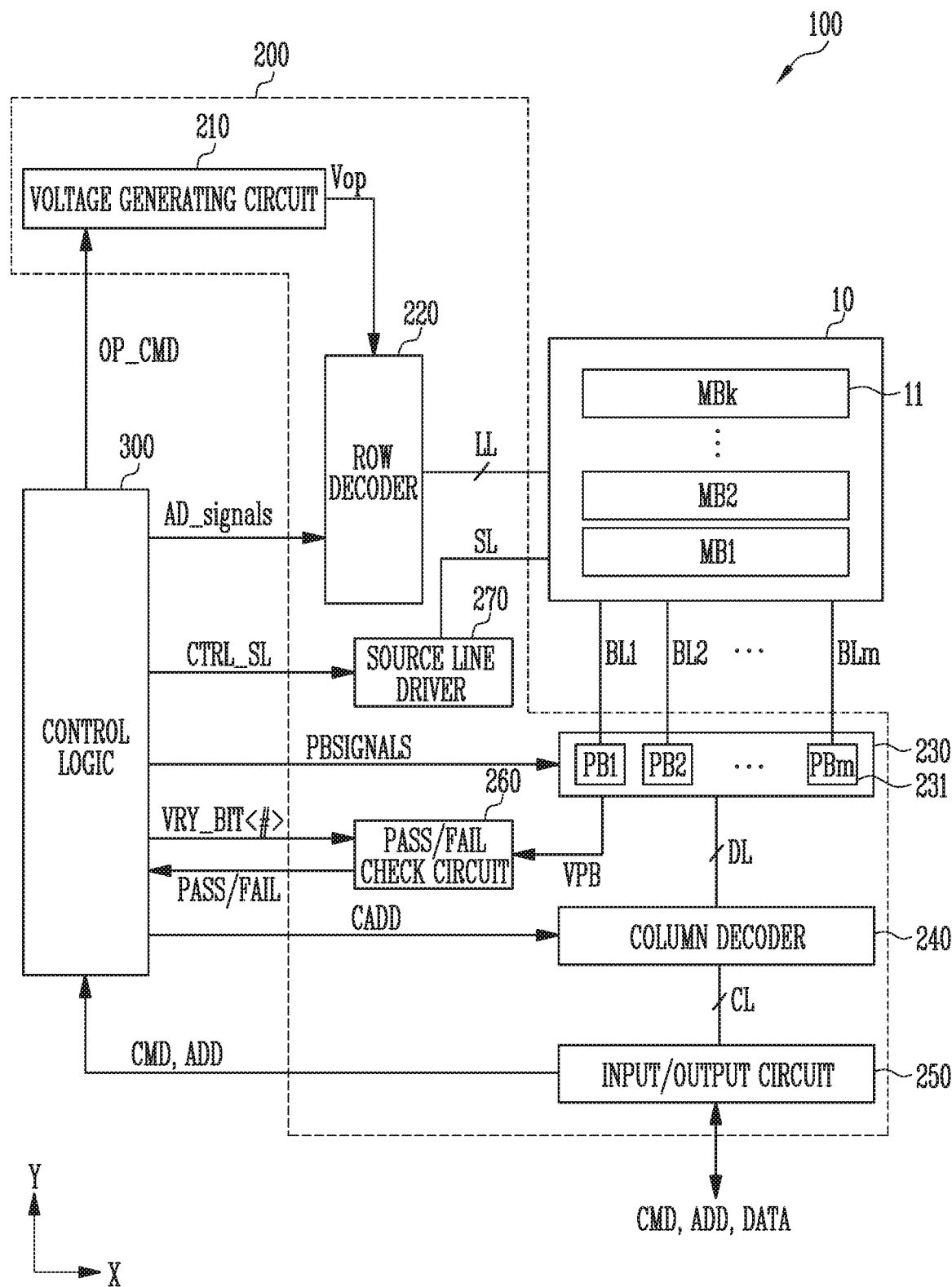
FIG. 3 is a diagram illustrating a semiconductor memory, such as that shown in FIG. 1.

FIG. 3 is a diagram illustrating the semiconductor memory 100 shown in FIG. 1.

Referring to FIG. 3, the semiconductor memory 100 may include a memory cell array 10 that stores data. The semiconductor memory 100 may include a peripheral circuit 200 configured to perform a program operation for storing data in the memory cell array 10, a read operation for outputting the stored data, and an erase operation for erasing the stored data. The semiconductor memory 100 may include control logic 300 that controls the peripheral circuit 200 under the control of the controller 1200 shown in FIG. 1. Also, the semiconductor memory 100 may set read voltages used in a normal read operation and a read retry operation according to information on read voltages received from the controller 1200.

The memory cell array 10 may include memory blocks MB1 to MBk (k is a positive integer) 11. Local lines LL and bit lines BL1 to BLm (m is a positive integer) may be coupled to the memory blocks MB1 to MBk 11. For example, the local lines LL may include a first select line, a second select line, and a plurality of word lines arranged between the first and second select lines. Also, the local lines LL may further include dummy lines arranged between the first select line and the word lines, and between the second select line and the word lines. The first select line may be a source select line, and the second select line may be a drain select line. For example, the local lines LL may include word lines, drain and source select lines, and source lines SL. For example, the local lines LL may further include dummy lines. For example, the local lines LL may further include pipe lines. The local lines LL may be coupled to the memory blocks MB1 to MBk 11, respectively, and the bit lines BL1 to BLm may be commonly coupled to the memory blocks MB1 to MBk 11. The memory blocks MB1 to MBk 11 may be implemented in a two-dimensional or three-dimensional structure. For example, memory cells may be arranged in a direction parallel to a substrate in memory blocks 11 having a two-dimensional structure. For example, memory cells may be arranged in a direction vertical to a substrate in memory blocks 11 having a three-dimensional structure.

In an embodiment, at least one memory block (e.g., MB1) among the plurality of memory blocks MB1 to MBk 11 may be defined as a system memory block, and the system memory block may store read retry table information on the other memory blocks (e.g., MB2 to MBk), and the read retry table information stored in the system memory block may be read in a power-on operation of the memory system 1000 shown in FIG. 1 to be transmitted to the controller 1200 shown in FIG. 1.

In another embodiment, each of the plurality of memory blocks MB1 to MBk 11 may store read retry table information corresponding thereto, and read retry table information stored in each memory block may be read in the power-on operation of the memory system 1000 shown in FIG. 1 to be transmitted to the controller 1200 shown in FIG. 1. The read retry table information may be stored in one or more specific pages of each memory block.

The peripheral circuit 200 may be configured to perform program, read, and erase operations of a selected memory block 11 under the control of the control logic 300. For example, the peripheral circuit 200 may include a voltage generating circuit 210, a row decoder 220, a page buffer group 230, a column decoder 240, an input/output circuit 250, a pass/fail check circuit 260, and a source line driver 270.

The voltage generating circuit 210 may generate various operating voltages Vop used for program, read, and erase operations in response to an operation signal OP_CMD. Also, the voltage generating circuit 210 may selectively discharge the local lines LL in response to the operation signal OP_CMD. For example, the voltage generating circuit 210 may generate a program voltage, a verify voltage, a pass voltage, and a select transistor operation voltage under the control of the control logic 300. The voltage generating circuit 210 may generate initially set read voltages used in a normal read operation and new read voltages used in a read retry operation under the control of the control logic 300.

The row decoder 220 may transfer the operating voltages Vop to local lines LL coupled to the selected memory block 11 in response to control signals AD_signals. For example, the row decoder 220 may selectively apply operation voltages (e.g., a program voltage, a verify voltage, a pass voltage, and the like) generated by the voltage generating circuit 210 to word lines among the local lines LL in response to the control signals AD_signals.

In a program voltage applying operation, the row decoder 220 applies a program voltage generated by the voltage generating circuit 210 to a selected word line among the local lines LL in the control signals AD_signals, and applies a pass voltage generated by the voltage generating circuit 210 to the other unselected word lines. Also, in a read operation, the row decoder 220 applies a read voltage generated by the voltage generating circuit 210 to a selected word line among the logical lines LL in response to the control signals AD_signals, and applies a pass voltage generated by the voltage generating circuit 210 to the other unselected word lines.

The page buffer group 230 may include a plurality of page buffers PB1 to PBm 231 coupled to the bit lines BL1 to BLm. The page buffers PB1 to PBm 231 may operate in response to page buffer control signals PBSIGNALS. For example, the page buffers PB1 to PBm 231 may temporarily store data to be programmed in a program operation, or sense voltages or currents of the bit lines BL1 to BLm in a read or verify operation.

The column decoder 240 may transfer data between the input/output circuit 250 and the page buffer group 230 in response to a column address CADD. For example, the column decoder 240 may exchange data with the page buffers 231 through data lines DL, or exchange data with the input/output circuit 250 through column lines CL.

The input/output circuit 250 may transfer a command CMD and an address ADD, which are received from the controller 1200 shown in FIG. 1, to the control logic 300, or exchange data DATA with the column decoder 240.

In a read operation, the pass/fail check circuit 260 may generate a reference current in response to an allow bit VRY_BIT<#>, and output a pass signal PASS or a fail signal FAIL by comparing a sensing voltage VPB received from the page buffer group 230 with a reference voltage generated by the reference current.

The source line driver 270 may be coupled to a memory cell included in the memory cell array 10 through a source line SL, and control a voltage applied to the source line SL. The source line driver 270 may receive a source line control signal CTRL_SL from the control logic 300, and control a source line voltage applied to the source line SL, based on the source line control signal CTRL_SL.

The control logic 300 may control the peripheral circuit 200 by outputting the operation signal OP_CMD, the control signals AD_signals, the page buffer control signals PBSIGNALS, and the allow bit VRY_BIT<#> in response to the command CMD and the address ADD. Also, the control logic 300 may determine whether the verify operation has passed or failed in response to the pass or fall signal PASS or FAIL. Also, the control logic 300 may control the voltage generating circuit 210 to generate initially set read voltages used in a normal read operation according to information on the initially set read voltages, which is received from the controller 1200 shown in FIG. 1 in the normal read operation, and control the voltage generating circuit 210 to generate new read voltages used in a read retry operation according to information on the new read voltages, which is received from the controller 1200 shown in FIG. 1 in the read retry operation. The new read voltages are read voltages corresponding to a program state included in the threshold voltage regions other than a specific threshold voltage region among a plurality of threshold voltage regions.

Figure 4:
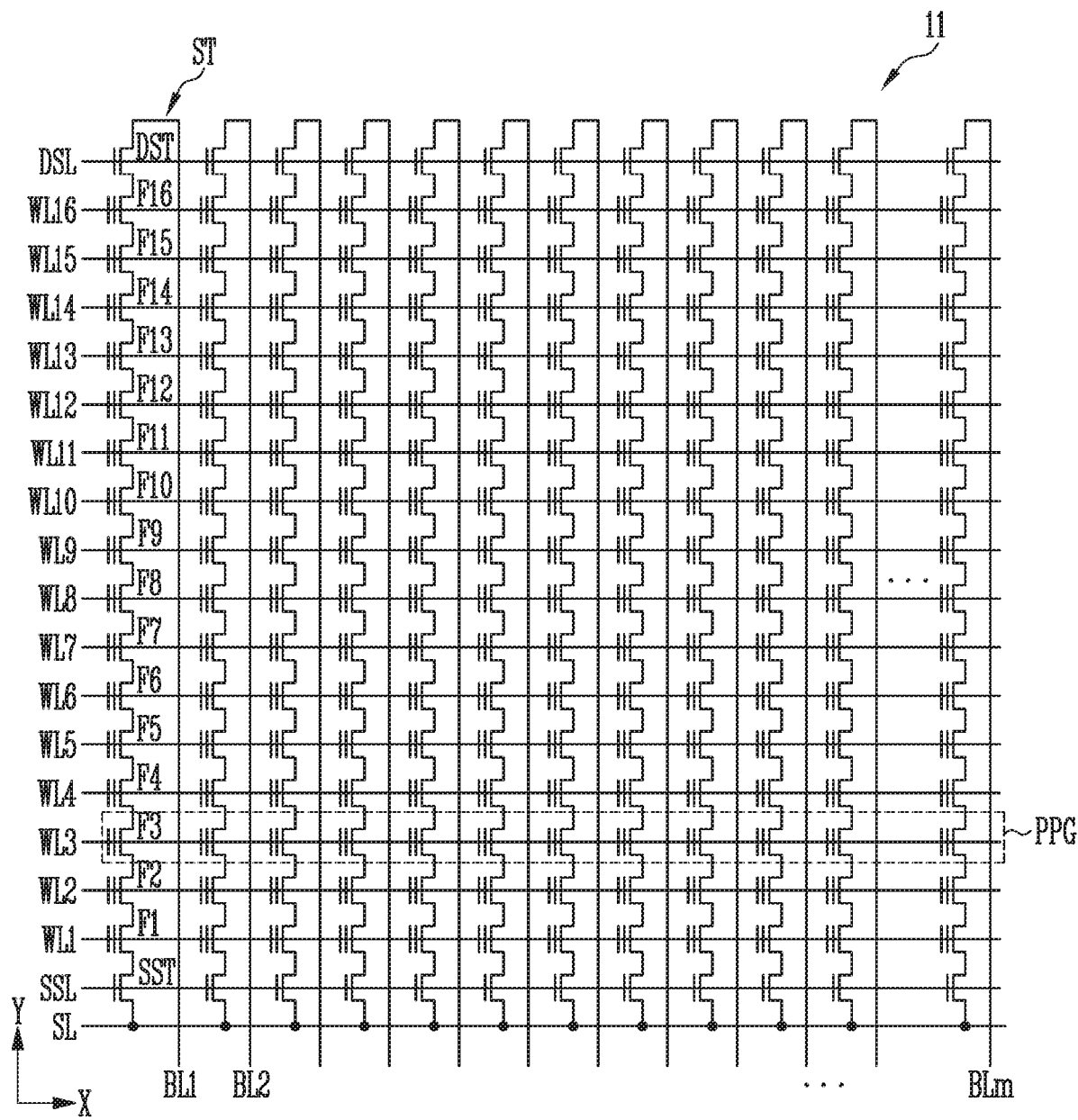
FIG. 4 is a diagram illustrating a memory block, such as that shown in FIG. 3.

FIG. 4 is a diagram illustrating the memory block shown in FIG. 3.

Referring to FIG. 4, in the memory block 11, a plurality of word lines arranged in parallel to one another may be coupled between a first select line and a second select line. The first select line may be a source select line SSL, and the second select line may be a drain select line DSL. Specifically, the memory block 11 may include a plurality of strings ST coupled between bit lines BL1 to BLm and a source line SL. The bit lines BL1 to BLm may be coupled to the strings ST, respectively, and the source line SL may be commonly coupled to the strings ST. The strings ST may be configured identically to one another, and therefore, a string ST coupled to a first bit line BL1 will be described in detail as an example.

The string ST may include a source select transistor SST, a plurality of memory cells F1 to F16, and a drain select transistor DST, which are coupled in series to each other between the source line SL and the first bit line BL1. At least one source select transistor SST and at least one drain select transistor DST may be included in one string ST, and more than 16 memory cells F1 to F16 shown in the drawing may be included in one string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of source select transistors SST included in different strings ST may be coupled to the source select line SSL, gates of drain select transistors DST included in different strings ST may be coupled to the drain select line DSL, gates of the memory cells F1 to F16 included in different strings ST may be coupled to a plurality of word lines WL1 to WL16. A group of memory cells coupled to the same word line among the memory cells included in different strings ST may be a physical page PPG. Therefore, physical pages PPG of which number corresponds to that of the word lines WL1 to WL16 may be included in the memory block 11.

A memory cell may be a single level cell (SLC) that stores one bit of data. One physical page PPG may store one logical page (LPG) data. One LPG data may include data bits corresponding to the number of cells included in one physical page PPG. Also, a memory cell may be a multi-level cell (MLC) that stores multiple bits of data. Sometimes an MLC is reserved for a memory cell that stores two bits of data, and triple level cell (TLC) is used for a memory cell that stores three bits of data. One physical page PPG may store two or more LPG data.

In an embodiment, when each of the memory blocks MB1 to MBk shown in FIG. 3 stores read retry table information corresponding thereto, each of the memory blocks MB1 to MBk may define at least one physical page PPG as a system page, and store read retry table information in the system page. The read retry table information may be stored using a level cell scheme lower than a program scheme of the other pages to improve reliability, and perform program and read operations. For example, when normal data is stored in the other pages by using a triple level cell (TLC) scheme, the read retry table information may be stored in the system page by using an SLC scheme or MLC scheme. Also, the read retry table information may be stored using the same scheme as the normal data to efficiently utilize a storage space. For example, when the normal data is stored in the other pages by using the TLC scheme, the read retry table information may be stored in the system page by using the TLC scheme.

Figure 5:
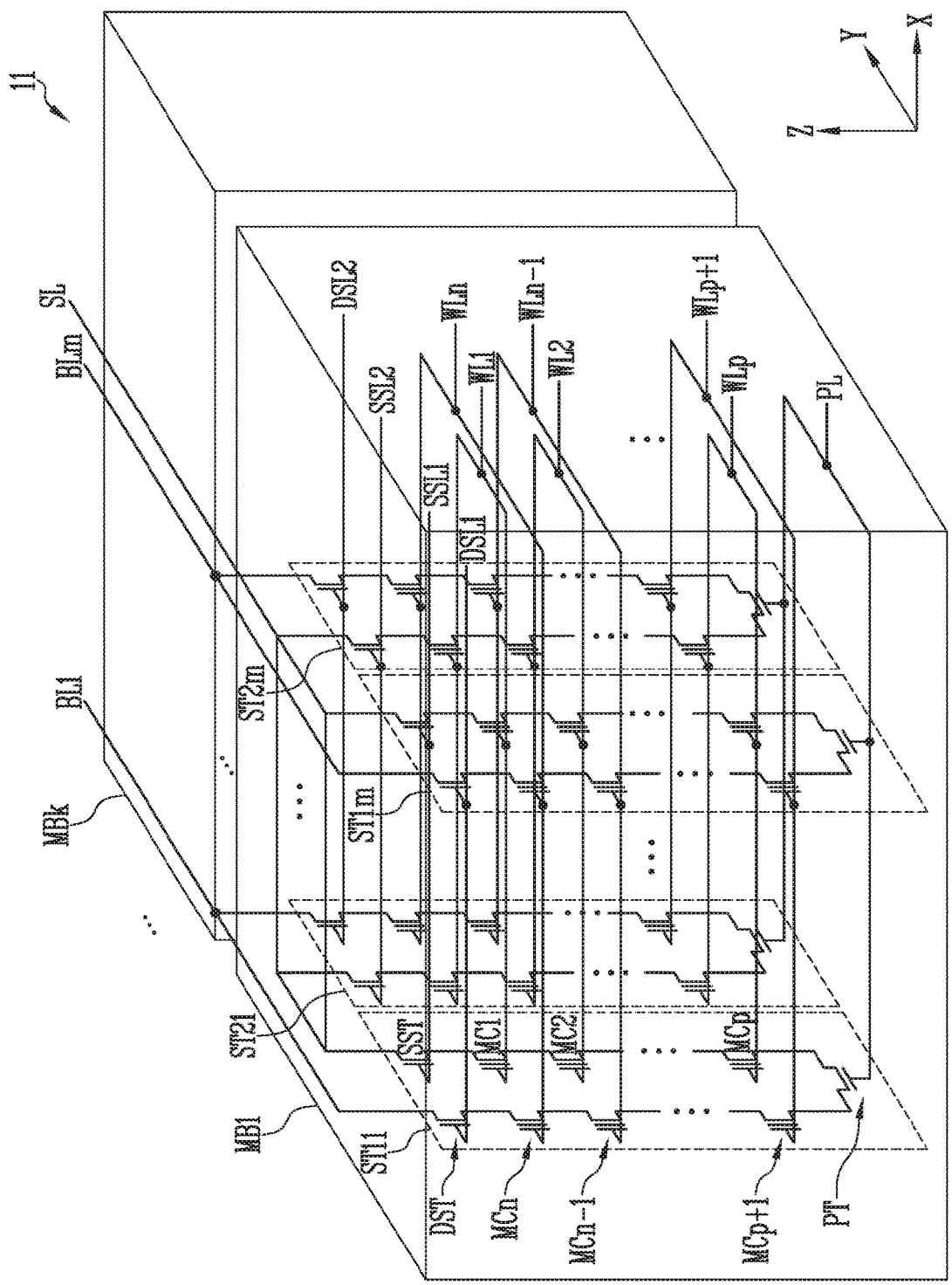
FIG. 5 is a diagram illustrating an embodiment of a three-dimensionally configured memory block.

FIG. 5 is a diagram illustrating an embodiment of a three-dimensionally configured memory block.

Referring to FIG. 5, the memory cell array 10 may include memory blocks MB1 to MBk 11. The memory block 11 may include a plurality of strings ST11 to ST1m and ST21 to ST2m. In an embodiment, each of the plurality of strings ST11 to ST1m and ST21 to ST2m may be formed in a 'U' shape. In the memory block 11, m strings may be arranged in a row direction (X direction). A configuration in which two strings are arranged in a column direction (Y direction) is illustrated in FIG. 5; however, this is merely an example for clarity. In another embodiment, three or more strings may be arranged in the column direction (Y direction).

Each of the plurality of strings ST11 to ST1m and ST21 to ST2m may include at least one source select transistor SST, first to nth memory cells MC1 to MCn, a pipe transistor PT, and at least one drain select transistor DST.

The source and drain select transistors SST and DST and the memory cells MC1 to MCn may have structures similar to one another. For example, each of the source and drain select transistors SST and DST and the memory cells MC1 to MCn may include a channel layer, a tunnel insulating layer, a charge trapping layer, and a blocking insulating layer. For example, a pillar for providing the channel layer may be provided in each string. For example, a pillar for providing at least one of the channel layer, the tunnel insulating layer, the charge trapping layer, and the blocking insulating layer may be provided in each string.

The source select transistor SST of each string may be coupled between a source line SL and memory cells MC1 to MCp.

In an embodiment, source select transistors of strings arranged in the same row may be coupled to a source select line extending in the row direction, and source select transistors of strings arranged in different rows may be coupled to different source select lines. In FIG. 5, source select transistors of strings ST11 to ST1m of a first row may be coupled to a first source select line SSL1. Source select transistors of strings ST21 to ST2m of a second row may be coupled to a second source select line SSL2.

In another embodiment, the source select transistors of the strings ST11 to ST1m and ST21 to ST2m may be commonly coupled to one source select line.

First to nth memory cells MC1 to MCn of each string may be coupled between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a vertical direction (Z direction), and be coupled in series to each other between the source select transistor SST and the pipe transistor PT. The (p+1)th to nth memory cells MCp+1 to MCn may be sequentially arranged in the vertical direction (Z direction), and be coupled in series to each other between the pipe transistor PT and the drain select transistor DST. The first to pth memory cells MC1 to MCp and the (p+1)th to nth memory cells MCp+1 to MCn may be coupled to each other through the pipe transistor PT. Gates of the first to nth memory cells MC1 to MCn of each string may be coupled to first to nth word lines WL1 to WLn, respectively.

In an embodiment, at least one of the first to nth memory cells MC1 to MCn may be used as a dummy memory cell. When a dummy memory cell is provided, the voltage or current of a corresponding string can be stably controlled. A gate of the pipe transistor PT of each string may be coupled to a pipe line PL.

The drain select transistor DST of each string may be coupled to a bit line and the memory cells MCp+1 to MCn. Strings arranged in the row direction may be coupled to a drain select line extending in the row direction. Drain select transistors of the strings ST11 to ST1m, of the first row may be coupled to a first drain select line DSL1. Drain select transistors of the strings ST21 to ST2m of the second row may be coupled to a second drain select line DSL2.

Strings arranged in the column direction may be coupled to bit lines extending in the column direction. In FIG. 5, strings ST11 and ST21 of a first column may be coupled to a first bit line BL1. Strings ST1m and ST2m of an mth column may be coupled to an mth bit line BLm.

Memory cells coupled to the same word line among the strings arranged in the row direction may constitute one page. For example, memory cells coupled to the first word line WL1 among the strings ST11 to ST1m of the first row may constitute one page. Memory cells coupled to the first word line WL1 among the strings ST21 to ST2m of the second row may constitute another page. When any one of the drain select lines DSL1 and DSL2 is selected, strings arranged in one row direction may be selected. When any one of the word lines WL1 to WLn is selected, one page among the selected strings may be selected.

Figure 6:
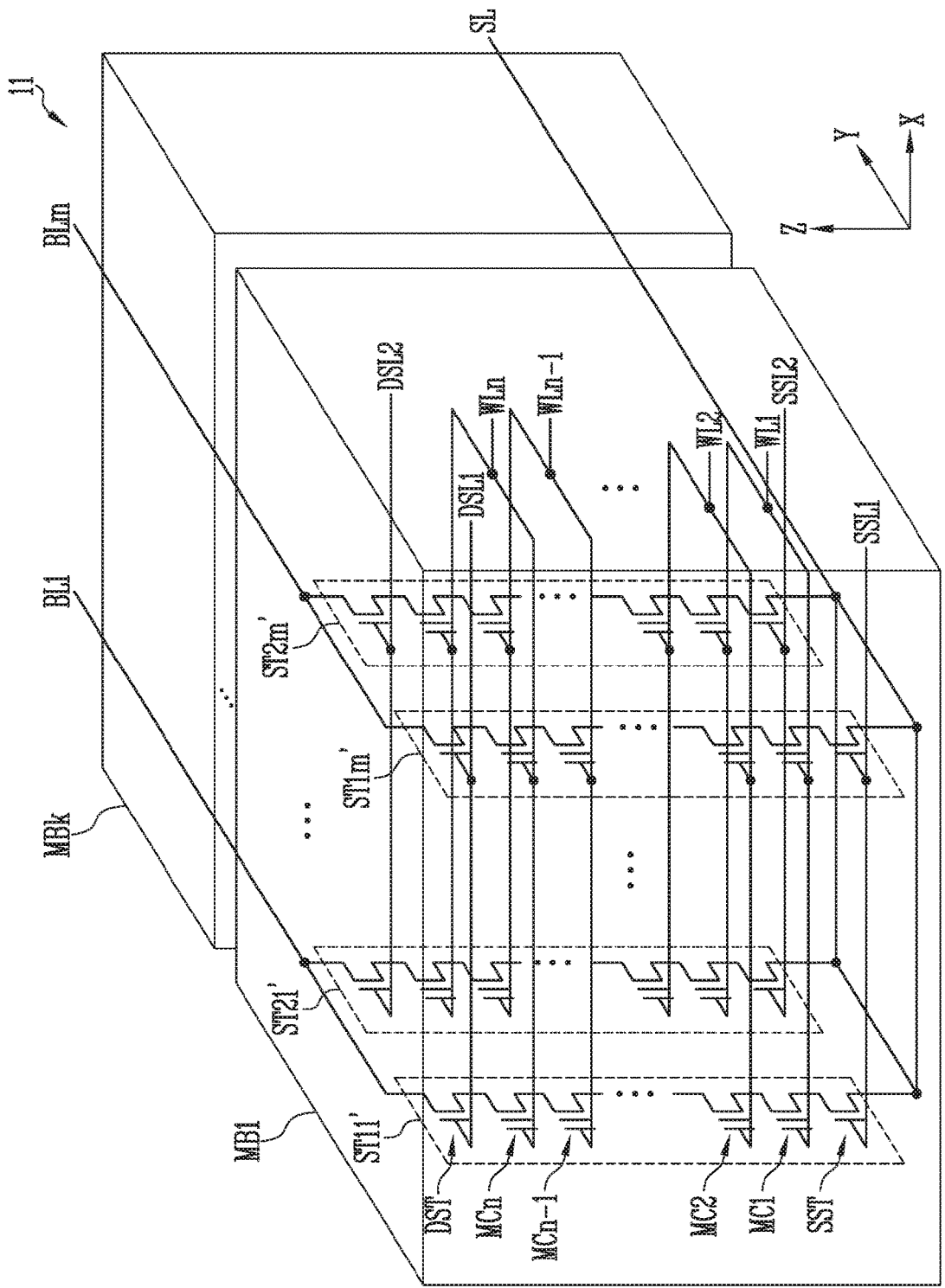
FIG. 6 is a diagram illustrating another embodiment of a three-dimensionally configured memory block.

FIG. 6 is a diagram illustrating another embodiment of the three-dimensionally configured memory block.

Referring to FIG. 6, the memory cell array 10 may include a plurality of memory blocks MB1 to MBk 11. The memory block 11 may include a plurality of strings ST11' to ST1m' and ST21' to ST2m'. Each of the plurality of strings ST11' to ST1m' and ST21' to ST2m' may extend along a vertical direction (Z direction). In the memory block 11, m strings may be arranged in a row direction (X direction). A configuration in which two strings are arranged in a column direction (Y direction) is illustrated in FIG. 6; however, this is merely an example for clarity. In another embodiment, three or more strings may be arranged in the column direction (Y direction).

Each of the plurality of strings ST11' to ST1m' and ST21' to ST2m' may include at least one source select transistor SST, first to nth memory cells MC1 to MCn, and at least one drain select transistor DST.

The source select transistor SST of each string may be coupled between a source line SL and the memory cells MC1 to MCn. Source select transistors of strings arranged in the same row may be coupled to the same source select line. Source select transistors of strings ST11' to ST1m' arranged on a first row may be coupled to a first source select line SSL1. Source select transistors of strings ST21' to ST2m' arranged on a second row may be coupled to a second source select line SSL2. In another embodiment, the source select transistors of the strings ST11' to ST1m' and ST21' to ST2m' may be commonly coupled to one source select line.

The first to nth memory cells MC1 to MCn of each string may be coupled in series to each other between the source select transistor SST and the drain select transistor DST. Gates of the first to nth memory cells MC1 to MCn may be coupled to first to nth word lines WL1 to WLn, respectively.

In an embodiment, at least one of the first to nth memory cells MC1 to MCn may be used as a dummy memory cell. When a dummy memory cell is provided, the voltage or current of a corresponding string can be stably controlled. Accordingly, the reliability of data stored in the memory block 11 can be improved.

The drain select transistor DST of each string may be coupled between a bit line and the memory cells MC1 to MCn. Drain select transistors DST of strings arranged in the row direction may be coupled to a drain select line extending in the row direction. The drain select transistors DST of the strings ST11' to ST1m' of the first row may be coupled to a first drain select line DSL1. The drain select transistors DST of the strings ST21' to ST2m' of the second row may be coupled to a second drain select line DSL2.

FIG. 7 is a threshold voltage distribution diagram illustrating threshold voltage distributions according to program states of memory cells in accordance with an embodiment of the present disclosure.

Threshold voltage distributions of memory cells programmed using a TLC scheme are described as an example. However, principles of the present invention are also applicable to other memory cell level schemes.

Each of the memory cells programmed using the TLC scheme may be programmed to any one of first to eighth program states P0 to P7. The first program state P0, which is an erase state, may receive stress caused by a read voltage when a read operation is repeatedly performed after a program operation is completed, and accordingly, additional charges are trapped in a charge trap layer of the memory cell. Therefore, the threshold voltage distribution of the first program state P0 may increase as shown in the drawing. In addition, a relatively large number of charges are trapped in charge trap layers of memory cells corresponding to program states, e.g., the sixth to eighth program states P5 to P7 having relatively high threshold voltage distributions, and some of the charges are de-trapped when time elapses after a program operation is completed. Therefore, the threshold voltage distributions of these program states may decrease as shown in the drawing. On the other hand, charges trapped in charge trap layers of memory cells corresponding to middle program states, e.g., the second to fifth program states P1 to P4 having threshold voltage distributions, that are higher than that of the first program (erase) state P0 and lower than those of the program states (e.g., P5 to P7) have a stable state, as compared with the program states P0 and P5 to P7. For example, charges trapped in the charge trap layers of the memory cells corresponding to the program states (e.g., P1 to P4) are de-trapped within a short period of time after the charges are trapped in the charge trap layers in a program operation. After this, the probability that de-trapped charges will occur is low even when time elapses. Although the read operation is repeatedly performed, a certain amount of charges have already been trapped, and hence the probability that additionally trapped charges will occur is also low. Thus, read stress and a variation in threshold voltage distribution according to lapse of time are relatively low.

In an embodiment of the present disclosure, the plurality of program states P0 to P7 may be grouped into first to third threshold voltage regions (Zone 1 to Zone 3) according to threshold voltage distributions. For example, the first program state P0 as the erase state may be included in the first threshold voltage region (Zone 1), the program states (e.g., P5 to P7) that have relatively high threshold voltage distributions and have the threshold voltage distributions decreasing as time elapses may be included in the third threshold voltage region (Zone 3), and the program states (e.g., P1 to P4) having relatively stable threshold voltage distributions may be included in the second threshold voltage region (Zone 2).

The number of program states included in the second threshold voltage region (Zone 2) may vary from a minimum of one program state to a maximum of four program states. The second threshold voltage region may be a threshold voltage region of −0.5 V to 1.0 V.

FIG. 8 is a threshold voltage distribution diagram illustrating threshold voltage distributions according to program states of memory cells in accordance with another embodiment of the present disclosure.

In the context of FIG. 8, threshold voltage distributions of memory cells programmed using a quad level cell (QLC) scheme are described as an example.

Each of the memory cells programmed using the QLC scheme may be programmed to any one of first to sixteenth program states P0 to P15. The first program state P0, which is an erase state, may receive stress caused by a read voltage when a read operation is repeatedly performed after a program operation is completed, and accordingly, additional charges are trapped in a charge trap layer of the memory cell. Therefore, the threshold voltage distribution of the first program state P0 may increase as shown in the drawing. In addition, a relatively large number of charges are trapped in charge trap layers of memory cells corresponding to program states, e.g., the tenth to sixteenth program states P9 to P15 having relatively high threshold voltage distributions, and some of the charges are de-trapped when time elapses after a program operation is completed. Therefore, the threshold voltage distributions of these program states may decrease as shown in the drawing. On the other hand, charges trapped in charge trap layers of memory cells corresponding to middle program states, e.g., the second to ninth program states P1 to P8 having threshold voltage distributions, that are higher than that of the first (erase) program state P0 and lower than those of the program states (e.g., P9 to P15) have a stable state, as compared with the other program states P0 and P9 to P15. For example, charges trapped in the charge trap layers of the memory cells corresponding to the program states (e.g., P1 to P4) are de-trapped within a short period of time after the charges are trapped in the charge trap layers in a program operation. After this, the probability that de-trapped charges will occur is low even when time elapses. Although the read operation is repeatedly performed, a certain amount of charges have already been trapped, and hence the probability that additionally trapped charges will occur is also low. Thus, read stress and a variation in threshold voltage distribution according to lapse of time are relatively low.

In an embodiment of the present disclosure, the plurality of program states P0 to P15 may be grouped into first to third threshold voltage regions (Zone 1 to Zone 3) according to threshold voltage distributions. For example, the first program state P0 as the erase state may be included in the first threshold voltage region (Zone 1), the program states (e.g., P9 to P15) that have relatively high threshold voltage distributions and that decrease as time elapses may be included in the third threshold voltage region (Zone 3), and the program states (e.g., P1 to P8) having relatively stable threshold voltage distributions may be included in the second threshold voltage region (Zone 2). The second threshold voltage region (Zone 2) may be a threshold voltage region of −1.5 V to 1.0 V or a threshold voltage region of −1.0 V to 1.5 V.

The number of program states included in the second threshold voltage region Zone 2 may vary from a minimum of one program state to a maximum of eight program states.

Figure 9:
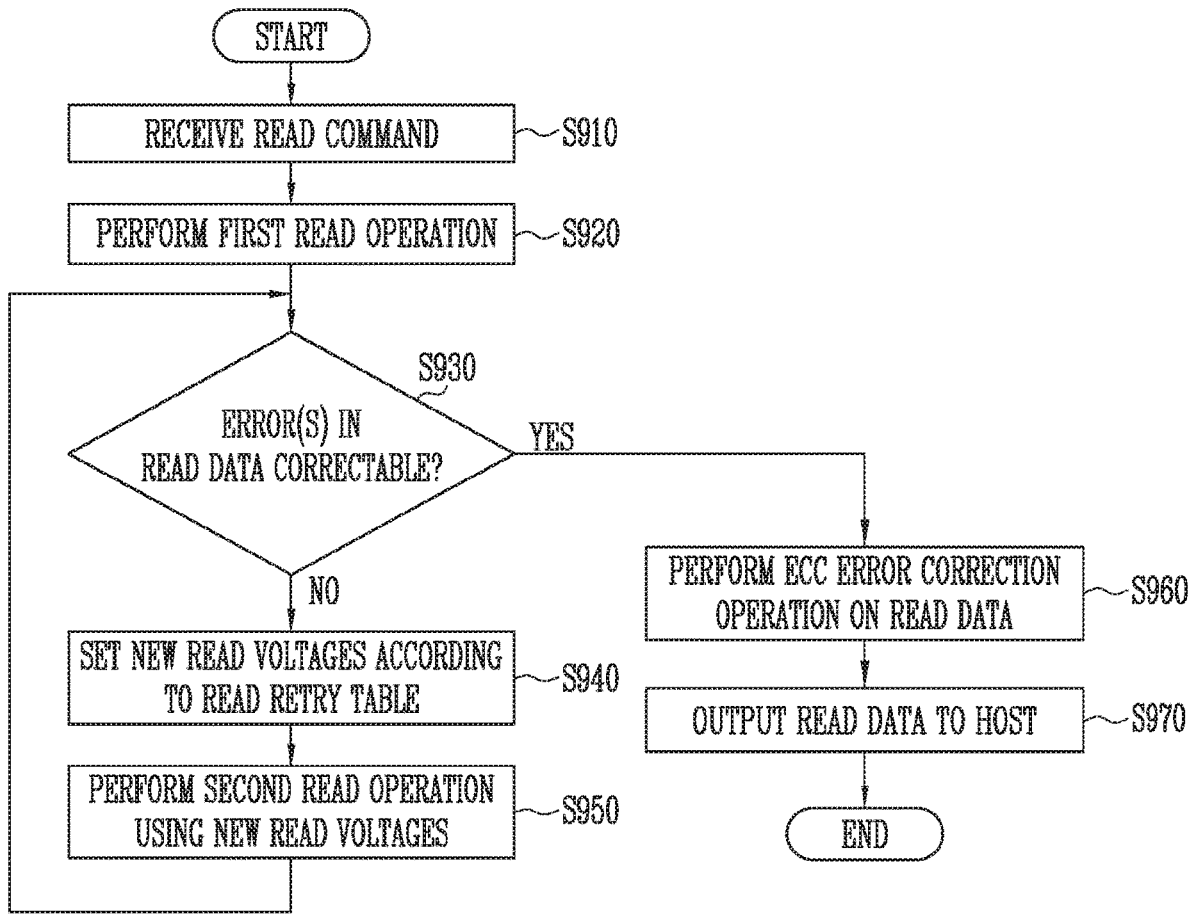
FIG. 9 is a flowchart illustrating a read operation method of the memory system in accordance with an embodiment of the present disclosure.

FIG. 9 is a flowchart illustrating a read operation method of the memory system in accordance with an embodiment of the present disclosure.

Such read operation method of the memory system is described with reference not only to FIG. 9 but also with reference to FIGS. 1 to 8.

A case in which a read operation is performed on a memory block (e.g., MB1) programmed using a TLC scheme is described as an example.

The memory system 1000 reads a read retry table stored in a plurality of semiconductor memories 100 included in the memory device 1100 in a power-on operation, and stores the read retry table in the buffer memory 1230 of the controller 1200.

The controller 1200 receives a read command from the host 1300 (S910). For example, the processor 1220 of the controller 1200 receives a host command Host_CMD corresponding to a read operation from the host 1300 through the host control circuit 1210.

The processor 1220 generates a command queue in response to the host command Host_CMD, and generates and outputs an internal command CMD for controlling the read operation of the memory device 1100 in response to the command queue.

A selected semiconductor memory among the plurality of semiconductor memories 100 in the memory device 1100 receives the internal command CMD, and performs a first read operation in response to the internal command CMD (S920). The first read operation may be defined as a normal read operation.

The first read operation may be performed using initially set read voltages R1 to R7, and information thereon may be received from the read voltage setting block 1240 of the controller 1200.

The first read operation is performed as described below.

The control logic 300 sets read voltages by receiving the information on the initially set read voltages R1 to R7 from the controller 1200, and controls the peripheral circuit 200 to perform the first read operation according to the set read voltages. For example, the voltage generating circuit 210 generates one read voltage (e.g., R1) and a pass voltage in response to the operation signal OP_CMD, and the row decoder 220 selectively applies the read voltage and the pass voltage, which are generated by the voltage generating circuit 210, to the word lines among the local lines LL in response to the control signals AD_signals. The page buffers PB1 to PBm 231 perform a read operation by sensing voltages or current of the bit lines BL1 to BLm.

Subsequently, the voltage generating circuit 210 generates a next read voltage (e.g., R2) and a pass voltage, and the row decoder 220 selectively applies the read voltage and the pass voltage, which are generated by the voltage generating circuit 210, to the word lines among the local lines LL in response to the control signals AD_signals. The page buffers PB1 to PBm 231 perform a read operation by sensing voltages or current of the bit lines BL1 to BLm.

The first read operation is performed by sequentially performing the read operations using the initially set read voltages R1 to R7.

Read data read by the first read operation is transmitted to the controller 1200, and the error correction circuit 1250 of the controller 1200 determines whether error(s) in the read data received from the memory device 1100 can be corrected by performing an error bit count operation on the read data (S930). For example, the error correction circuit 1250 determines whether error(s) in the read data received from the memory device 1100 can be corrected by comparing a number of error bits in the read data with a maximum allowable error bit number of the error correction circuit 1250.

In the above-described determination step (S930), when the number of error bits in the read data is greater than the maximum allowable error bit number, it is determined that the error(s) in the read data cannot be corrected, in which case the ECC error correction operation is not to be performed (No at S930). Thus, flow proceeds to step S940 where the read voltage setting block 1240 sets a new read voltage based on the read retry table stored in the buffer memory 1230.

The read voltage setting block 1240 transmits information of the new read voltage to the selected semiconductor memory 100 of the memory device 1100, and the selected semiconductor memory 100 performs a second read operation using the new read voltage (S950). The second read operation may be defined as a read retry operation.

The new read voltage includes read voltages corresponding to the program states included in the first threshold voltage region (Zone 1) and the third threshold voltage region (Zone 3), which are shown in FIG. 7, and read voltages corresponding to the program states included in the second threshold voltage region (Zone 2) shown in FIG. 7 are not included in the new read voltage.

The second read operation is similar to the first read operation described above. The second read operation is performed using new read voltages instead of the initially set read voltages. The read operation on the second threshold voltage region (Zone 2) may be performed using initial setting read voltages R2 to R4 instead of the new read voltages. Alternatively, the read operation on the second threshold voltage region may be skipped. When the read operation on the second threshold voltage region is skipped, the read data corresponding to the second threshold voltage region, which is read as a result of performing the first read operation may serve as read data corresponding to the second threshold voltage region in the second read operation.

Subsequently, read data read by the second read operation is transmitted to the controller 1200 and the process returns to step S930 for a subsequent iteration.

In the above-described determination step (S930), when the number of error bits included in the read data is less than or equal to the maximum allowable error bit number of the error correction circuit 1250, it is determined that the error(s) in the read data received from the memory device 1100 can be corrected (Yes at S930), and thus the error correction circuit 1250 performs an ECC error correction operation, i.e., ECC decoding on the read data received from the error correction circuit 1250 (S960).

Subsequently, the ECC-decoded read data is output to the host 1300 (S970), and the read operation ends.

Figure 10:
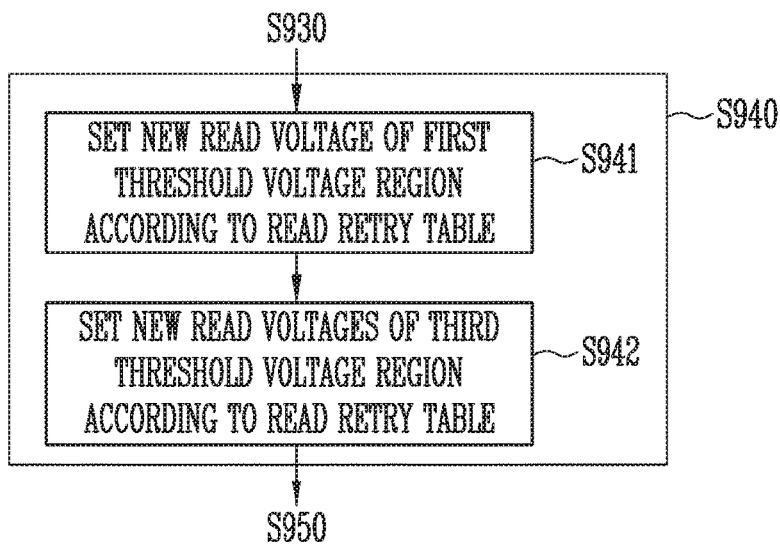
FIG. 10 is a flowchart illustrating in detail step S940 shown in FIG. 9.

FIG. 10 is a flowchart illustrating in detail the step S940 shown in FIG. 9.

Figure 11:
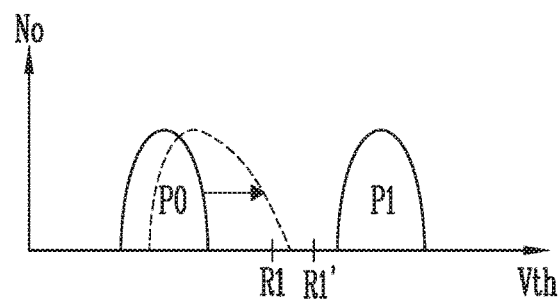
FIG. 11 is a threshold voltage distribution diagram illustrating a method for setting a read voltage of a first threshold voltage region.

FIG. 11 is a threshold voltage distribution diagram illustrating a method for setting a read voltage of the first threshold voltage region.

Figure 12:
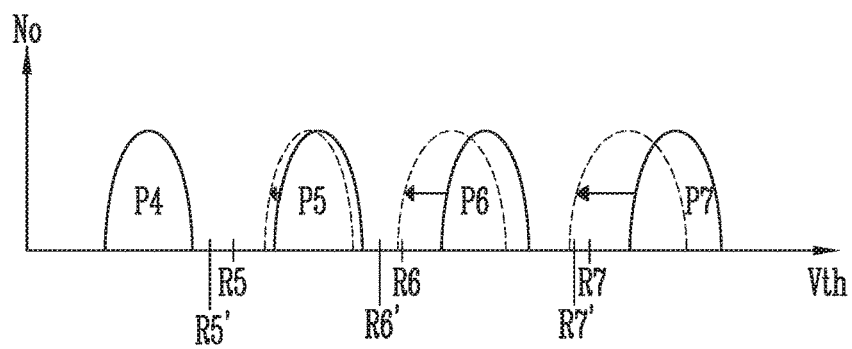
FIG. 12 is a threshold voltage distribution diagram illustrating a method for setting a read voltage of a third threshold voltage region.

FIG. 12 is a threshold voltage distribution diagram illustrating a method for setting a read voltage of the third threshold voltage region.

A method for setting a new read voltage according to the read retry table is described below with reference to FIGS. 10 to 12.

In the determination step (S930) shown in FIG. 9, when the number of error bits included in the read data is less than or equal to the maximum allowable error bit number of the error correction circuit 1250, it is determined that the error(s) in the read data received from the memory device 1100 cannot be corrected, and a new read voltage R1' corresponding to the first program state P0 in the first threshold voltage region (Zone 1) is set according to the read retry table stored in the buffer memory 1230 (S941).

For example, the first program state P0 as the erase state may receive stress caused by a read voltage when a read operation is repeatedly performed after a program operation is completed, and accordingly, additional charges are trapped in a charge trap layer of the memory cell. Therefore, the threshold voltage distribution of the first program state P0 may increase as shown in FIG. 11. Accordingly, the new read voltage R' may be increased as compared with the initially set read voltage R1 and may also be increased as compared with a read voltage used in a previous read operation. However, the new read voltage R' may be lower than the lowest threshold voltage of the second program state P1.

Therefore, in the first program state P0, erroneous data may be read in the first read operation using the initially set read voltage R1, and the number of error bits in the read data may be relatively high. However, the number of error bits in read data decrease relative to those in the first read operation in the second read operation using the new read voltage R1'.

Subsequently, new read voltages R5', R6', and R7' corresponding to the sixth to eighth program states P5 to P7 in the third threshold voltage region (Zone 3) are set according to the read retry table (S942).

For example, since the sixth to eighth program states P5 to P7 have relatively high threshold voltage distributions among the plurality of program states P0 to P7 shown in FIG. 7, some charges are de-trapped as time elapses after a program operation is completed. Therefore, the threshold voltage distributions of the program states P5 to P7 may decrease as shown in FIG. 11.

Accordingly, the new read voltages R5, R6', and R7' may be decreased as compared with the initially set read voltages R5, R6, and R7 and may also be decreased as compared with read voltages used in a previous read operation. However, the new read voltages R5, 1R6' and R7' may be higher than the highest threshold voltage of the fourth program state P3.

Therefore, in the sixth to eighth program states P5 to P7, erroneous data may be read in the first read operation using the initially set read voltages R5, R6, and R7, and the number of error bits in the read data may be relatively high. However, the number of error bits in read data decrease in the second read operation relative to those in the first read operation using the new read voltages R5', R6' and R7'.

As described above, in accordance with embodiments of the present disclosure, a read retry operation is skipped with respect to the second threshold voltage region (Zone 2) in which the threshold voltage distributions are most stable, and a read retry operation is performed with respect to only the other threshold voltage regions (Zone 1 and Zone 3), so that the read operation speed of the memory system is improved.

Figure 13:
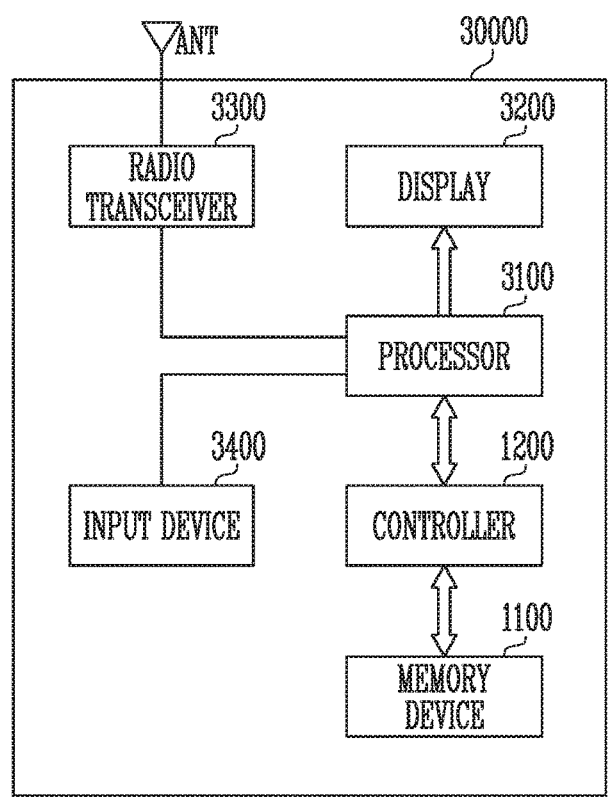
FIG. 13 is a diagram illustrating another embodiment of the memory system.

FIG. 13 is a diagram illustrating another embodiment of the memory system.

Referring to FIG. 13, the memory system 30000 may be implemented as a cellular phone, a smart phone, a tablet PC, a personal digital assistant (PDA), or a wireless communication device. The memory system 30000 may include a memory device 1100 and a controller 1200 capable of controlling an operation of the memory device 1100. The controller 1200 may control a data access operation of the memory device 1100, e.g., a program operation, an erase operation, a read operation, or the like under the control of a processor 3100.

Data programmed in the memory device 1100 may be output through a display 3200 under the control of the controller 1200.

A radio transceiver 3300 may transmit/receive radio signals through an antenna ANT. For example, the radio transceiver 3300 may convert a radio signal received through the antenna ANT into a signal that can be processed by the processor 3100. Therefore, the processor 3100 may process a signal output from the radio transceiver 3300 and transmit the processed signal to the controller 1200 or the display 3200. The controller 1200 may transmit the signal processed by the processor 3100 to the memory device 1100. Also, the radio transceiver 3300 may convert a signal output from the processor 3100 into a radio signal, and output the radio signal to an external device through the antenna ANT. An input device 3400 is capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the controller 1200, data output from the radio transceiver 3300, or data output from the input device 3400 can be output through the display 3200.

In some embodiments, the controller 1200 capable of controlling an operation of the memory device 1100 may be implemented as a part of the processor 3100, or be implemented as a chip separate from the processor 3100. Also, the controller 1200 may be implemented with the controller shown in FIG. 2.

Figure 14:
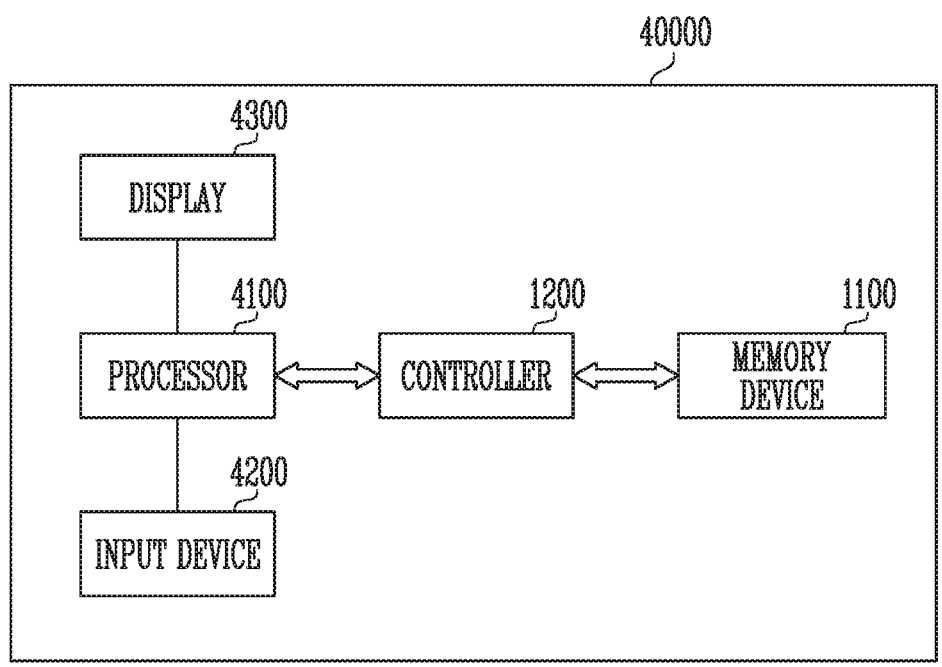
FIG. 14 is a diagram illustrating another embodiment of the memory system.

FIG. 14 is a diagram illustrating another embodiment of the memory system.

Referring to FIG. 14, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 1100 and a controller 1200 capable of controlling a data processing operation of the memory device 1100.

A processor 4100 may output data stored in the memory device 1100 through a display 4300 according to data input through an input device 4200. For example, the input device 4200 may be implemented as a pointing device such as a touch pad, a computer mouse, a keypad, or a keyboard.

The processor 4100 may control overall operations of the memory system 40000, and control an operation of the controller 1200. In some embodiments, the controller 1200 capable of controlling an operation of the memory device 1100 may be implemented as a part of the processor 4100, or be implemented as a chip separate from the processor 4100. Also, the controller 1200 may be implemented with the controller shown in FIG. 2.

Figure 15:
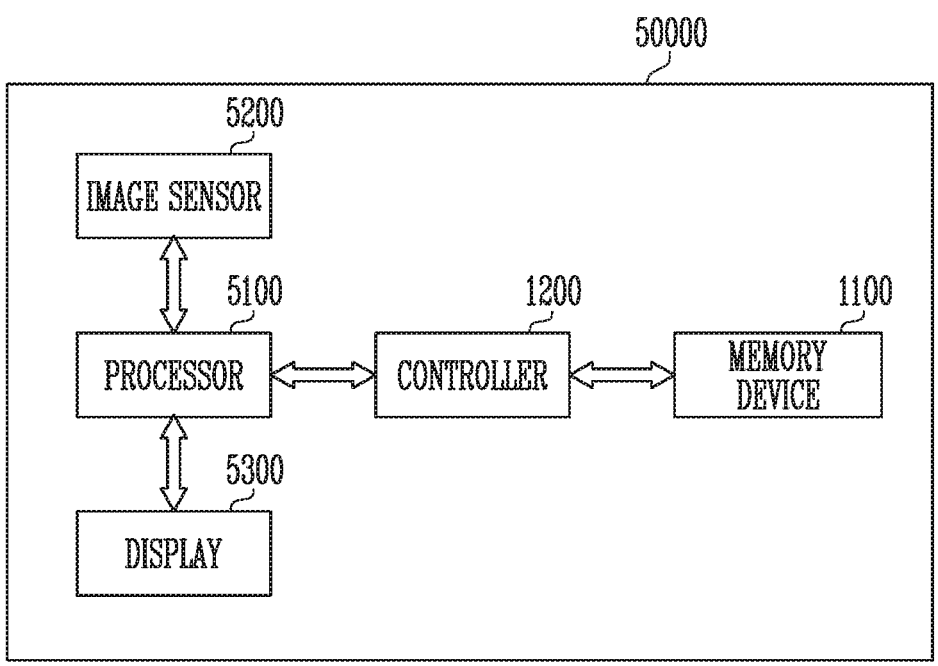
FIG. 15 is a diagram illustrating another embodiment of the memory system.

FIG. 15 is a diagram illustrating another embodiment of the memory system.

Referring to FIG. 15, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 1100 and a controller 1200 capable of controlling a data processing operation of the memory device 1100, e.g., a program operation, an erase operation, or a read operation.

An image sensor 5200 of the memory system 50000 may convert an optical image into digital signals, which may be transmitted to a processor 5100 or the controller 1200. Under the control of the processor 5100, the digital signals may be output through a display 5300, or be stored in the memory device 1100 through the controller 1200. In addition, data stored in the memory device 1100 may be output through the display 5300 under the control of the processor 5100 or the controller 1200.

In some embodiments, the controller 1200 capable of controlling an operation of the memory device 1100 may be implemented as a part of the processor 5100, or be implemented as a chip separate from the processor 5100. Also, the controller 1200 may be implemented with the controller shown in FIG. 2.

Figure 16:
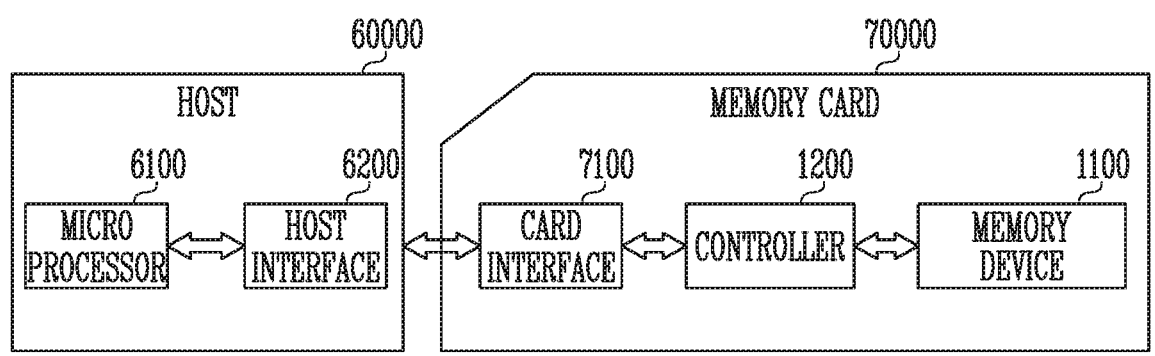
FIG. 16 is a diagram illustrating another embodiment of the memory system.

FIG. 16 is a diagram illustrating another embodiment of the memory system.

Referring to FIG. 16, the memory system 70000 may be implemented as a memory card or a smart card. The memory system 70000 may include a memory device 1100, a controller 1200, and a card interface 7100.

The controller 1200 may control data exchange between the memory device 1100 and the card interface 7100. In some embodiments, the card interface 7100 may be a secure digital (SD) card interface or a multi-media card (MMC) interface, but the present invention is not limited thereto. Also, the controller 1200 may be implemented with the controller shown in FIG. 2.

The card interface 7100 may interface data exchange between a host 60000 and the controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host Interface 6200 of the host 60000 such as a PC, a tablet PC, a digital camera, a digital audio player, a cellular phone, console video game hardware, or a digital set-top box, the host interface 6200 may perform data communication with the memory device 1100 through the card Interface 7100 and the controller 1200 under the control of a microprocessor 6100.

In accordance with embodiments of the present invention, in a read operation, a read retry operation is skipped with respect to a specific program state having a relatively small variation in threshold voltage distribution among a plurality of program states, and a read retry operation is performed with respect to only the other program states, so that the read operation speed of the memory system can be improved.

While the present invention has been shown and described with reference to certain embodiments thereof, it will be understood by those skilled in the art in light of the present disclosure that various changes in form and details may be made therein without departing from the spirit and scope of the present invention as defined by the appended claims and their equivalents. Therefore, the scope of the present invention should not be limited to the above-described embodiments but should be determined by the appended claims and their equivalents.

In the above-described embodiments, depending on context, some steps may be selectively performed or combined and in some cases not all steps may be performed. Moreover, steps are not necessarily performed in accordance with the described order and may be rearranged. More generally, embodiments disclosed herein are only examples to facilitate an understanding of the present invention, not to limit it. That is, it should be apparent to those skilled in the art that various modifications can be made on the basis of the technological scope of the present disclosure.

Although specific terminologies are used here, such use is only to describe embodiments of the present invention, not to limit the embodiments. Therefore, the present invention is not restricted to the above-described embodiments. Rather, many variations and modification are possible within the spirit and scope of the present invention, which encompasses all such variations and modifications to the extent they fall within the scope of the appended claims.

What is claimed is:

1. A memory device comprising:
a memory cell array including a plurality of memory blocks;
a peripheral circuit configured to perform a read operation by applying a plurality of read voltages to a selected memory block among the plurality of memory blocks; and
control logic configured to control the peripheral circuit to perform a normal read operation using the plurality of read voltages and a read retry operation using at least one new read voltage,
wherein the peripheral circuit performs the read retry operation on all of memory cells included in the selected memory block and programmed to a plurality of program states, and in the read retry operation, applies the plurality of read voltages respectively corresponding to the plurality of program states to the all of the memory cells and skips an operation for applying a read voltage corresponding to at least one specific program state among the plurality of program states,
wherein the at least one specific program state has a stable threshold voltage distribution according to lapse of time in a range of −0.5 V to 1.0 V when the selected memory block is programmed using a triple level cell (TLC) scheme, and in a range of −1.5 V to 1.0 V or −1.0 V to 1.5 V when the selected memory block is programmed using a quad level cell (QLC) scheme.

2. The memory device of claim 1, wherein the plurality of program states are grouped into first to third threshold voltage regions according to a threshold voltage distribution of each of the program states.

3. The memory device of claim 2,
wherein an erase state among the plurality of program states is included in the first threshold voltage region,
wherein the at least one specific program state among the plurality of program states has a threshold voltage distribution that is higher than that of the first threshold voltage region and the at least one specific program state is included in the second threshold voltage region, and
wherein at least one program state other than the erase state and the at least one specific program state among the plurality of program states has a threshold voltage distribution that is higher than that of the second threshold voltage region and the at least one program state is included in the third threshold voltage region.

4. The memory device of claim 3, wherein at least one of the plurality of memory blocks stores read retry table information corresponding to each of the plurality of memory blocks.

5. The memory device of claim 4, wherein, in the read retry operation, the at least one new read voltage is set based on the read retry table information corresponding to the selected memory block.

6. The memory device of claim 4, wherein the read retry table information includes information on the at least one new read voltage corresponding to the program states included in the first threshold voltage region and the third threshold voltage region among the plurality of program states.

7. The memory device of claim 4, wherein the peripheral circuit performs the read retry operation by using at least one increased read voltage as compared with at least one read voltage used in a previous read operation with respect to a program state included in the first threshold voltage region.

8. The memory device of claim 4, wherein the peripheral circuit performs the read retry operation by using at least one decreased read voltage as compared with at least one read voltage used in a previous read operation with respect to program states included in the third threshold voltage region.

9. The memory device of claim 1, wherein, in the read retry operation, the peripheral circuit performs a new read operation for the at least one specific program state using the plurality of read voltages which are used in the read operation.

10. A memory system comprising:
a memory device including a plurality of memory blocks and a peripheral circuit for performing a normal read operation and a read retry operation on a selected memory block among the plurality of memory blocks; and
a controller configured to control the memory device to perform the normal read operation in response to a request received from a host, and control the memory device to perform the read retry operation according to a number of error bits of read data received from the memory device,
wherein, in the read retry operation, the controller controls the memory device to perform the read retry operation on all of memory cells included in the selected memory block and programmed to a plurality of program states, and in the read retry operation, to apply a plurality of read voltages respectively corresponding to the plurality of program states to the all of the memory cells and to skip an operation for applying a read voltage corresponding to at least one specific program state among the plurality of program states,
wherein the at least one specific program state has a stable threshold voltage distribution according to lapse of time in a range of −0.5 V to 1.0 V when the selected memory block is programmed using a triple level cell (TLC) scheme, and in a range of −1.5 V to 1.0 V or −1.0 V to 1.5 V when the selected memory block is programmed using a quad level cell (QLC) scheme.

11. The memory system of claim 10,
wherein an erase state among the plurality of program states is included in a first threshold voltage region,
wherein the at least one specific program state among the plurality of program states has a threshold voltage distribution that is higher than that of the first threshold voltage region and the at least one specific program state is included in a second threshold voltage region, and
wherein at least one program state other than the erase state and the at least one specific program state among the plurality of program states has a threshold voltage distribution that is higher than that of the second threshold voltage region and the at least one program state is included in a third threshold voltage region.

12. The memory system of claim 11,
wherein at least one of the plurality of memory blocks stores read retry table information corresponding to each of the plurality of memory blocks, and
wherein, in a power-on operation, the controller reads the read retry table information stored in the memory device, and stores the read retry table information in the controller.

13. The memory system of claim 12,
wherein the controller includes a read voltage setting block,
wherein the read voltage setting block:
transmits, to the memory device, information on initially set read voltages in the normal read operation of the memory device,
sets at least one new read voltage, based on the read retry table information in the read retry operation, and
wherein the at least one new read voltage corresponds to the program states other than the at least one specific program state.

14. The memory system of claim 13, wherein the read voltage setting block:
sets at least one new increased read voltage as compared with at least one read voltage used in a previous read operation with respect to the erase state included in the first threshold voltage region as the at least one new read voltage used in the read retry operation; and
sets at least one new decreased read voltage as compared with at least one read voltage used in a previous read operation with respect to the at least one program state included in the third threshold voltage region as the at least one new read voltage used in the read retry operation.

15. The memory system of claim 10,
wherein the controller includes an error correction circuit, and
wherein the error correction circuit detects the error bits included in the read data received from the memory device, and performs an error correction operation on the read data.

16. The memory system of claim 10, wherein, in the read retry operation, the controller controls the memory device to perform a new read operation for the at least one specific program state using at least one initially set read voltage which is used in the normal read operation.

17. A method for operating a memory system, the method comprising:
- reading a read retry table stored in a memory device in a power-on operation;
- performing a normal read operation on a selected memory block among a plurality of memory blocks included in the memory device;
- determining whether an error correction operation is to be performed according to a number of error bits in data read in performing the normal read operation;
- setting at least one new read voltage, when it is determined that the error correction operation is not to be performed; and
- performing a read retry operation on the selected memory block using the at least one new read voltage,
- wherein the at least one new read voltage corresponds to program states other than at least one program state among a plurality of program states included in a specific threshold voltage region among a plurality of program states of the selected memory block, and
- wherein the performing of the read retry operation comprises:
- applying new read voltages respectively corresponding to program states other than at least one specific program state among the plurality of program states to all of memory cells included in the selected memory block; and
- skipping an operation for applying a new read voltage corresponding to the at least one specific program state to the all of the memory cells,
- wherein the at least one specific program state has a stable threshold voltage distribution according to lapse of time in a range of −0.5 V to 1.0 V when the selected memory block is programmed using a triple level cell (TLC) scheme, and in a range of −1.5 V to 1.0 V or −1.0 V to 1.5 V when the selected memory block is programmed using a quad level cell (QLC) scheme.

18. The method of claim 17,
- wherein an erase state among the plurality of program states is included in a first threshold voltage region,
- wherein the at least one specific program state among the plurality of program states has a threshold voltage distribution that is higher than that of the first threshold voltage region and the at least one specific program state is included in a second threshold voltage region, and
- wherein at least one program state other than the erase state and the at least one specific program state among the plurality of program states has a threshold voltage distribution that is higher than that of the second threshold voltage region and the at least one program state is included in a third threshold voltage region.

19. The method of claim 18,
- wherein one to four program states are included in the second threshold voltage region, when the selected memory block is programmed using the TLC scheme, and
- wherein one to eight program states are included in the second threshold voltage region, when the selected memory block is programmed using the QLC scheme.

20. The method of claim 17, further comprising:
- re-performing the determining of whether the error correction operation is to be performed, after the performing of the read retry operation; and
- performing the error correction operation on the read data and then outputting the read data to a host, when it is determined that the error correction operation is to be performed.

21. The method of claim 17, wherein, in the read retry operation, a new read operation is performed for the at least one specific program state using at least one initially set read voltage which is used in the normal read operation.

* * * * *